US012695284B2

(12) United States Patent
Irgens et al.

(10) Patent No.: US 12,695,284 B2
(45) Date of Patent: Jul. 28, 2026

(54) HIGH-SPEED FAULT ISOLATION FOR POWER SOURCES OF A VEHICLE

(71) Applicant: GM GLOBAL TECHNOLOGY OPERATIONS LLC, Detroit, MI (US)

(72) Inventors: Peter Rolf Irgens, Novi, MI (US); S.M. Nayeem Hasan, Novi, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 151 days.

(21) Appl. No.: 18/668,661

(22) Filed: May 20, 2024

(65) Prior Publication Data

US 2025/0357740 A1     Nov. 20, 2025

(51) Int. Cl.
H02H 1/00          (2006.01)
H02H 3/08          (2006.01)
(Continued)

(52) U.S. Cl.
CPC .......... H02H 1/0007 (2013.01); H02H 3/081 (2013.01); H02H 3/085 (2013.01);
(Continued)

(58) Field of Classification Search
CPC ...... H02H 1/0007; H02H 3/081; H02H 3/085; H02H 3/087; H02H 3/093; H02H 5/041;
(Continued)

(56) References Cited

U.S. PATENT DOCUMENTS 6,694,271 B1 *   2/2004   Hannon ................. H02H 7/261
                                                              702/58
9,979,180 B2     5/2018   Bader et al.
(Continued)

FOREIGN PATENT DOCUMENTS

DE       102022126802 A1     4/2023
DE       102021132451 A1     6/2023
WO         2020145029 A1     7/2020

OTHER PUBLICATIONS

German Office Action for German Application No. 102024119943. 1; dated Nov. 12, 2024; 6 pages.

*Primary Examiner* — Michael R. Fin
(74) *Attorney, Agent, or Firm* — CANTOR COLBURN LLP

(57)          ABSTRACT
Examples described herein provide a method that includes, responsive to determining that a direction of a current relative to a power source of a vehicle is a forward current flowing out of the power source, determining whether the forward current exceeds a forward current threshold for a forward overcurrent detection time period by comparing the current to the forward current threshold. The method further includes, responsive to determining that the direction of the current relative to the power source is a reverse current flowing into the power source, determining whether the reverse current exceeds a reverse current threshold for a reverse overcurrent detection time period shorter than the forward overcurrent detection time period by comparing the current to the reverse current threshold. The method further includes controlling, using a gate driver, at least one switch associated with the power source to inhibit the current.

20 Claims, 7 Drawing Sheets

(51) Int. Cl.

| | |
|---|---|
| *H02H 3/087* | (2006.01) |
| *H02H 3/093* | (2006.01) |
| *H02H 5/04* | (2006.01) |
| *H03K 17/08* | (2006.01) |
| *H03K 17/0812* | (2006.01) |

(52) U.S. Cl.
CPC ............ *H02H 3/087* (2013.01); *H02H 3/093* (2013.01); *H02H 5/041* (2013.01); *H03K 17/08122* (2013.01); *H03K 2017/0806* (2013.01); *H03K 2217/0027* (2013.01)

(58) Field of Classification Search
CPC ..... H03K 17/08122; H03K 2017/0806; H03K 2217/0027
USPC ........................................................ 361/93.1
See application file for complete search history.

(56) References Cited

U.S. PATENT DOCUMENTS

| | | | |
|---|---|---|---|
| 11,289,922 B2 | 3/2022 | Teusch | |
| 11,955,790 B2 | 4/2024 | Wortberg | |
| 12,142,907 B2 | 11/2024 | Behringer et al. | |
| 2020/0233441 A1* | 7/2020 | Morimoto | B60L 3/0076 |
| 2022/0230794 A1* | 7/2022 | Shima | H03K 17/08122 |
| 2022/0308612 A1* | 9/2022 | Muraoka | H02H 3/087 |
| 2025/0304020 A1* | 10/2025 | Alles | B60T 8/1701 |

* cited by examiner

| | Hardware OVC Threshold | | | | Software OVC Threshold | |
|---|---|---|---|---|---|---|
| | Forward OVC | Reverse OVC | Gate Driver OVC | Gate Driver OVT | Forward | Reverse |
| Power Source 1 | $I_{OVC\_FWD\_HW\_1}$ | $I_{OVC\_REV\_HW\_1}$ | $I_{OVC\_GD\_HW\_1}$ | $Temp_{SDN\_threshold}$ | > Normal Current | > Normal Current |
| Power Source 2 | $I_{OVC\_FWD\_HW\_2}$ | $I_{OVC\_REV\_HW\_2}$ | $I_{OVC\_GD\_HW\_2}$ | $Temp_{SDN\_threshold}$ | > Normal Current | > Normal Current |
| Power Source 3 | $I_{OVC\_FWD\_HW\_3}$ | $I_{OVC\_REV\_HW\_3}$ | $I_{OVC\_GD\_HW\_3}$ | $Temp_{SDN\_threshold}$ | > Normal Current | > Normal Current |

| | Hardware OVC Detection Time | | | | Software OVC Detection Time | |
|---|---|---|---|---|---|---|
| | Forward | Reverse | Gate Driver OVC | Gate Driver OVT | Forward | Reverse |
| Power Source 1 | $T_{FILTER\_FWD}$ | $T_{FILTER\_REV}$ | $T_{FILTER\_GD}$ | $T_{TEMP\_SDN}$ | $T_{DETECT\_SW}$ | $T_{DETECT\_SW}$ |
| Power Source 2 | $T_{FILTER\_FWD}$ | $T_{FILTER\_REV}$ | $T_{FILTER\_GD}$ | $T_{TEMP\_SDN}$ | $T_{DETECT\_SW}$ | $T_{DETECT\_SW}$ |
| Power Source 3 | $T_{FILTER\_FWD}$ | $T_{FILTER\_REV}$ | $T_{FILTER\_GD}$ | $T_{TEMP\_SDN}$ | $T_{DETECT\_SW}$ | $T_{DETECT\_SW}$ |

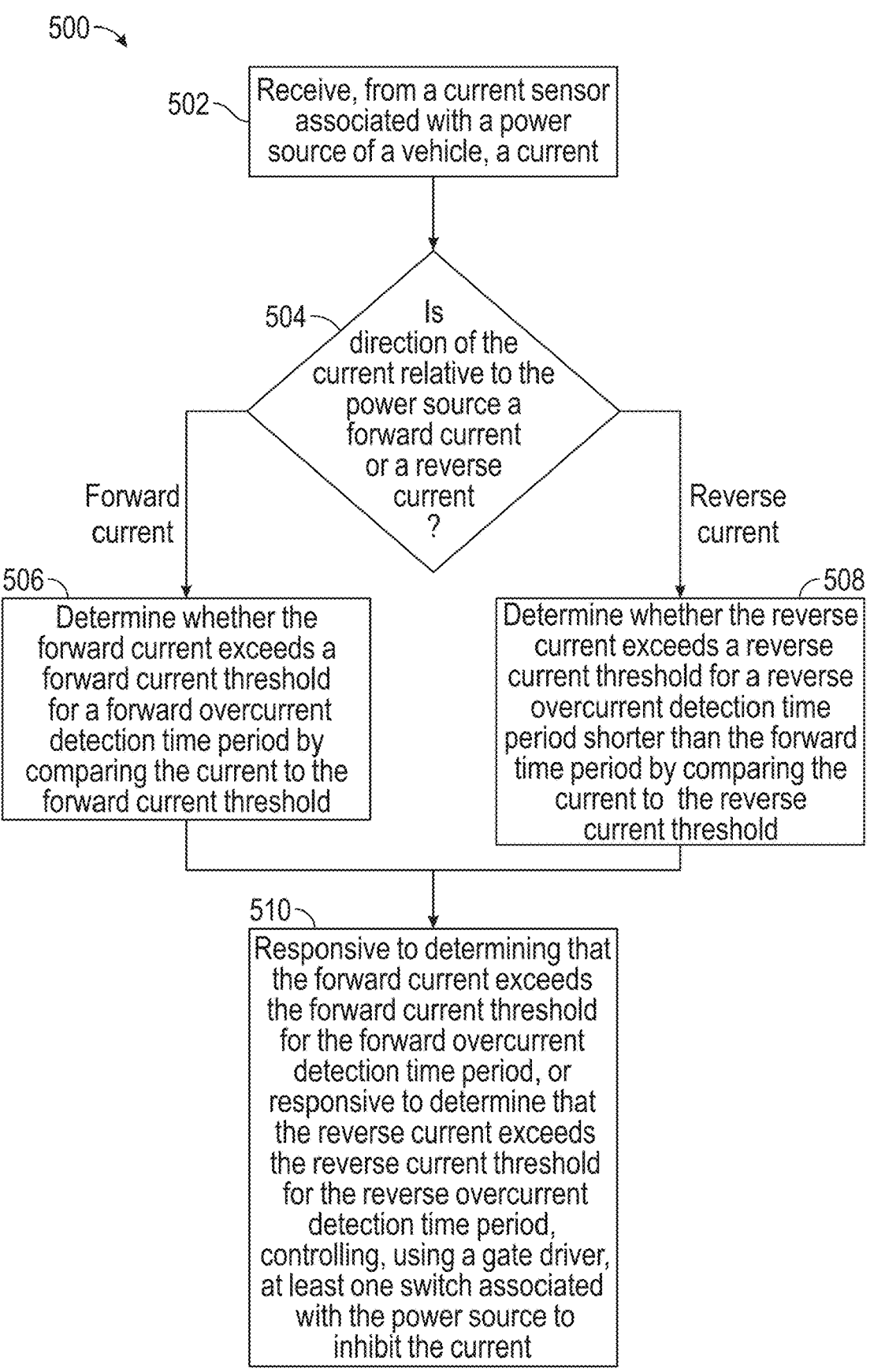

500

502 — Receive, from a current sensor associated with a power source of a vehicle, a current 504 — Is direction of the current relative to the power source a forward current or a reverse current ?

Forward current

Reverse current

506 — Determine whether the forward current exceeds a forward current threshold for a forward overcurrent detection time period by comparing the current to the forward current threshold 508 — Determine whether the reverse current exceeds a reverse current threshold for a reverse overcurrent detection time period shorter than the forward time period by comparing the current to the reverse current threshold 510 — Responsive to determining that the forward current exceeds the forward current threshold for the forward overcurrent detection time period, or responsive to determine that the reverse current exceeds the reverse current threshold for the reverse overcurrent detection time period, controlling, using a gate driver, at least one switch associated with the power source to inhibit the current

FIG. 5

HIGH-SPEED FAULT ISOLATION FOR POWER SOURCES OF A VEHICLE

The subject disclosure relates to vehicles, and in particular to high-speed fault isolation for power sources of a vehicle.

Modern vehicles (e.g., a car, a motorcycle, a boat, or any other type of automobile) may receive electrical power from one or more power sources and may provide electrical power to various systems of the vehicle. For example, an electric vehicle may include one or more batteries to store and provide electrical power to one or more electric motors, which provide propulsion to the vehicle. This configuration of vehicle is referred to as a battery electric vehicle (BEV). Other types of vehicles may also be equipped with batteries, such as vehicles with combustion engines, hybrid-electric vehicles, and/or the like, including combinations and/or multiples thereof. Other examples of components of vehicles that can use electric power (e.g., electrical power stored in a battery) include, but are not limited to, pumps, actuators, sensors, processing systems, displays, climate control systems, infotainment systems, engine control units, and/or the like, including combinations and/or multiples thereof.

SUMMARY

In one embodiment, a method is provided. The method includes receiving, from a current sensor associated with a power source of a vehicle, a current. The method further includes determining a direction of the current relative to the power source. The method further includes, responsive to determining that the direction of the current relative to the power source is a forward current flowing out of the power source, determining, by an overcurrent monitor, whether the forward current exceeds a forward current threshold for a forward overcurrent detection time period by comparing the current to the forward current threshold. The method further includes, responsive to determining that the direction of the current relative to the power source is a reverse current flowing into the power source, determining, by the overcurrent monitor, whether the reverse current exceeds a reverse current threshold for a reverse overcurrent detection time period shorter than the forward overcurrent detection time period by comparing the current to the reverse current threshold. The method further includes, responsive to determining that the forward current exceeds the forward current threshold for the forward overcurrent detection time period, or responsive to determining that the reverse current exceeds the reverse current threshold for the reverse overcurrent detection time period, controlling, using a gate driver, at least one switch associated with the power source to inhibit the current.

In addition to one or more of the features described herein, or as an alternative, further embodiments of the method may include that the current sensor is disposed in the gate driver.

In addition to one or more of the features described herein, or as an alternative, further embodiments of the method may include that the gate driver includes the current sensor, a temperature sense block to receive a temperature from a temperature sensor element, an overcurrent detection block, an overtemperature detection block, a gate drive block, and a control logic.

In addition to one or more of the features described herein, or as an alternative, further embodiments of the method may include that the gate drive block of the gate driver controls the at least one switch associated with the power source.

In addition to one or more of the features described herein, or as an alternative, further embodiments of the method may include that the overcurrent monitor includes a first comparator to detect overcurrent in the forward current and a second comparator to detect overcurrent in the reverse current.

In addition to one or more of the features described herein, or as an alternative, further embodiments of the method may include that the overcurrent monitor further includes a first latch associated with the first comparator to cause a gate drive block of the gate driver to control the at least one switch responsive to determining that the forward current exceeds the forward current threshold for the forward overcurrent detection time period.

In addition to one or more of the features described herein, or as an alternative, further embodiments of the method may include that the overcurrent monitor further includes a second latch associated with the second comparator to cause the gate drive block of the gate driver to control the at least one switch responsive to determining that the reverse current exceeds the reverse current threshold for the reverse overcurrent detection time period.

In addition to one or more of the features described herein, or as an alternative, further embodiments of the method may include transmitting a signal to a microprocessor responsive to determining that the forward current exceeds the forward current threshold for the forward overcurrent detection time period, or responsive to determining that the reverse current exceeds the reverse current threshold for the reverse overcurrent detection time period.

In addition to one or more of the features described herein, or as an alternative, further embodiments of the method may include detecting a gate driver fault of the gate driver, and responsive to detecting the gate driver fault of the gate driver, controlling, using the gate driver, the at least one switch associated with the power source to inhibit the current.

In addition to one or more of the features described herein, or as an alternative, further embodiments of the method may include that the at least one switch includes a N-type metal-oxide-semiconductor.

In another embodiment, a vehicle is provided. The vehicle includes a power source, at least one switch associated with the power source, and a fault detection circuit. The fault detection circuit includes a gate driver and an overcurrent monitor, the overcurrent monitor performing operations. The operations include receiving, from a current sensor of the gate driver, a current. The operations further include determining a direction of the current relative to the power source. The operations further include, responsive to determining that the direction of the current relative to the power source is a forward current flowing out of the power source, determining whether the forward current exceeds a forward current threshold for a forward overcurrent detection time period by comparing the current to the forward current threshold. The operations further include, responsive to determining that the direction of the current relative to the power source is a reverse current flowing into the power source, determining whether the reverse current exceeds a reverse current threshold for a reverse overcurrent detection time period shorter than the forward overcurrent detection time period by comparing the current to the reverse current threshold. The operations further include, responsive to determining that the forward current exceeds the forward current threshold for the forward overcurrent detection time period, or responsive to determining that the reverse current exceeds the reverse current threshold for the reverse overcurrent detection time period, causing the gate driver to control the at least one switch associated with the power source to inhibit the current.

In addition to one or more of the features described herein, or as an alternative, further embodiments of the vehicle may include that the current sensor is disposed in the gate driver.

In addition to one or more of the features described herein, or as an alternative, further embodiments of the vehicle may include that the gate driver comprises the current sensor, a temperature sense block to receive a temperature from a temperature sensor element, an overcurrent detection block, an overtemperature detection block, a gate drive block, and a control logic.

In addition to one or more of the features described herein, or as an alternative, further embodiments of the vehicle may include that the gate drive block of the gate driver controls the at least one switch associated with the power source.

In addition to one or more of the features described herein, or as an alternative, further embodiments of the vehicle may include that the overcurrent monitor comprises a first comparator to detect overcurrent in the forward current and a second comparator to detect overcurrent in the reverse current.

In addition to one or more of the features described herein, or as an alternative, further embodiments of the vehicle may include that the overcurrent monitor further comprises a first latch associated with the first comparator to cause a gate drive block of the gate driver to control the at least one switch responsive to determining that the forward current exceeds the forward current threshold for the forward overcurrent detection time period.

In addition to one or more of the features described herein, or as an alternative, further embodiments of the vehicle may include that the overcurrent monitor further comprises a second latch associated with the second comparator to cause the gate drive block of the gate driver to control the at least one switch responsive to determining that the reverse current exceeds the reverse current threshold for the reverse overcurrent detection time period.

In addition to one or more of the features described herein, or as an alternative, further embodiments of the vehicle may include that the operations further include transmitting a signal to a microprocessor responsive to determining that the forward current exceeds the forward current threshold for the forward overcurrent detection time period, or responsive to determining that the reverse current exceeds the reverse current threshold for the overcurrent detection reverse time period.

In addition to one or more of the features described herein, or as an alternative, further embodiments of the vehicle may include that the operations further include detecting a gate driver fault of the gate driver, and responsive to detecting the gate driver fault of the gate driver, controlling, using the gate driver, the at least one switch associated with the power source to inhibit the current.

In another embodiment, an overcurrent monitor for determining a forward overcurrent in a current flowing out of a power source of a vehicle in a forward direction or determining a reverse overcurrent of a current flowing into the power source of the vehicle in a reverse direction is provided. The overcurrent monitor includes a first comparator to detect forward overcurrent by comparing the current to detect forward overcurrent by comparing the current flowing out of the power source in the forward direction to a forward current threshold. The overcurrent monitor further includes a second comparator to detect reverse overcurrent by comparing the current flowing into the power source in the reverse direction to a reverse current threshold. The overcurrent monitor further includes a first filter to receive a first output of the first comparator and to apply a forward current timing threshold to the first output. The overcurrent monitor further includes a second filter to receive a second output of the second comparator and to apply a reverse current timing threshold to the second output, the forward current timing threshold being greater than the reverse current timing threshold. The overcurrent monitor further includes a first latch associated with the first comparator to cause a gate driver to control at least one switch associated with the power source responsive to determining that current flowing out of the power source in the forward direction exceeds the forward current threshold for the forward current timing threshold. The overcurrent monitor further includes a second latch associated with the second comparator to cause the gate driver to control the at least one switch associated with the power source responsive to determining that current flowing into the power source in the reverse direction exceeds the reverse current threshold for the reverse current timing threshold.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which:

FIG. 3 is a table of thresholds used to perform high-speed fault isolation for power sources of a vehicle according to one or more embodiments;

FIG. 5 is a flow diagram of a method for performing high-speed fault isolation for power sources of a vehicle according to one or more embodiments.

DETAILED DESCRIPTION

Figure 1:
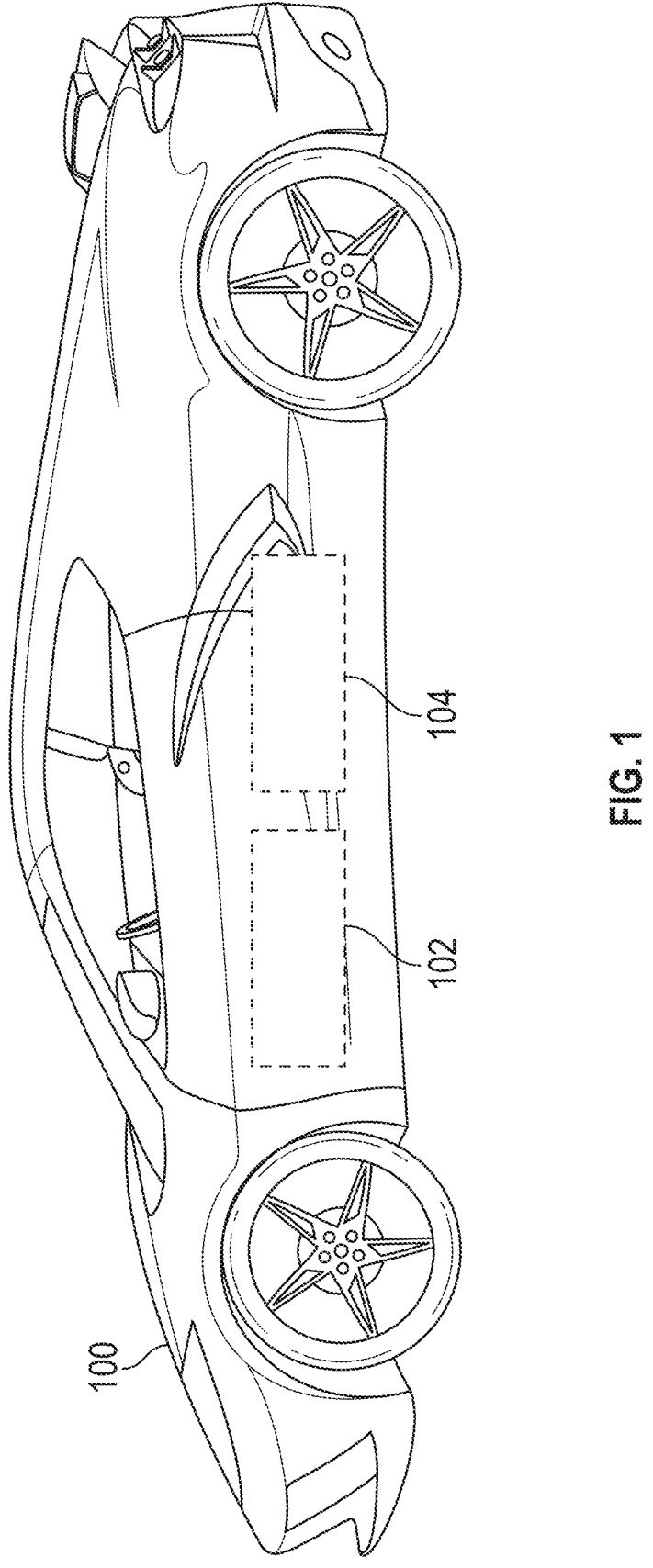
FIG. 1 is an illustration of a vehicle having a power source and a fault detection circuit for performing high-speed fault isolation for the power source according to one or more embodiments.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

One or more embodiments described herein relates to high-speed fault isolation for power sources of a vehicle. Some modern vehicles with one or more power sources use semiconductors to control power distribution throughout the vehicle. Multiple high-power sources (e.g., batteries) may be tied together through power ORing switches. It may be desirable to provide uninterrupted power to certain loads even if there is a fault at one power input until the vehicle can be safely stopped. That means a fault at one power input (e.g., short ground) should not cause non-faulted power input switches to open, and normal operation transients should not cause any of the power input switches to open. Market available gate drivers do not have sufficient overcurrent protections to prevent a single point fault (e.g., short to ground fault) at a power input from causing multiple power input switches from opening due to simultaneous fault detection. Also market available gate drivers cannot differentiate between normal operation transients and reasonably low-level overcurrent faults.

One or more embodiments described herein address these and other shortcomings by providing a hardware and software strategy for rationalizing the location of a high current fault and rapidly isolating the fault from a non-faulted power source so that critical loads of the vehicle can have uninterrupted power from the other power inputs until the safe stop of the vehicle or other corrective action can be implemented.

According to one or more embodiments, three types of faults can latch off a gate driver of a fault detection circuit. A first fault type is overcurrent in the forward direction (e.g., current flowing out of the power source). A second fault type is overcurrent in the reverse direction (e.g., current flowing into the power source, fault at the power source input, such as one power source input is shorted to ground and current is provided from another non-faulted power source). A third fault type is a gate driver fault, which is any sever fault identified by the gate driver. Hardware can detect overcurrent in the forward direction and reverse direction. Hardware forward and reverse overcurrent detection thresholds may be set at different levels. The reverse overcurrent detection time of a particular power input is set less than the forward overcurrent detection times of the other power inputs to prevent a hard short to ground from asserting false fault detection of non-faulted power inputs (e.g., latching off those power inputs). Both hardware forward and reverse overcurrent detection latch off the gate driver (e.g., open the switch) of the corresponding power input and assert fault detection interrupt to a microprocessor (also referred to as an "MCU"). Software may similarly detect overcurrent in the forward and reverse direction for soft short circuit condition and take action.

It should be appreciated that the functioning of a vehicle implementing one or more of the embodiments described herein is improved. For example, as described, one or more embodiments can provide fast isolation of faulted power inputs, uninterrupted power supply to vehicle critical loads (e.g., driver outputs 250 to driver loads) even if a fault is present at one power input, improved survivability of high current faults on power distribution inputs, and/or the like, including combinations and/or multiples thereof.

FIG. 1 is an illustration of a vehicle 100 having a power source 102 and a fault detection circuit 104 for performing high-speed fault isolation for the power source according to one or more embodiments. The vehicle 100 can be a car, a truck, a van, a bus, a motorcycle, a boat, or any other type of automobile. According to an embodiment, the vehicle 100 includes an internal combustion engine (not shown) fueled by gasoline, diesel, or the like. According to another embodiment, the vehicle 100 is a hybrid electric vehicle partially or wholly powered by electrical power, which may be provided in whole or in part by the power source 102 (e.g., a battery). According to another embodiment, the vehicle 100 is an electric vehicle powered by electrical power from the power source 102 (e.g., a battery). According to one or more embodiments, the vehicle 100 is an autonomous or semi-autonomous vehicle. An autonomous vehicle is a vehicle that has self-driving capabilities.

According to one or more embodiments, the vehicle 100 includes the power source 102 and the fault detection circuit 104. The power source 102 represents one or multiple power sources, which may vary in type, capacity, number, etc. Non-limiting examples of power sources include a battery (e.g., one or more batteries and/or battery systems), a power converter module (PCM) (e.g., a direct current (DC)/DC converter that provides power flow between a vehicle's high voltage DC bus and low voltage DC bus), another power grid (PG) (e.g., a low voltage (e.g., substantially 12 volt) power feed), and/or the like, including combinations and/or multiples thereof.

The power source 102 provides and/or receives electrical power, which can be used to power systems and/or components of the vehicle 100. More particularly, electrical power can flow into and/or out of the power source 102. Non-limiting examples of systems and/or components of the vehicle 100 that can be powered by the power source 102 include electric motors, pumps, actuators, sensors, processing systems, displays, climate control systems, infotainment systems, engine control units, and/or the like, including combinations and/or multiples thereof.

The fault detection circuit 104 can use current information collected about the power source 102 to perform high-speed fault isolation for the power source 102. More particularly, the fault detection circuit 104 can detect overcurrent in the forward direction (e.g., current flowing out of the power source 102), overcurrent in the reverse direction (e.g., current flowing into the power source 102), and/or a gate drive fault. For example, the fault detection circuit 104 can sense, using a current sensor, a value of current flowing out of (forward current) or into (reverse current) the power source 102. That is, the fault detection circuit 104 can sense both an amount of current and a direction (forward current or reverse current) of the current flowing with respect to the power source 102. The fault detection circuit 104 compares the amount of current to a current threshold depending on whether the current is a forward current or a reverse current. Forward current can have a separate current threshold (e.g., a forward current threshold) than the current threshold for reverse current (e.g., a reverse current threshold). The fault detection circuit 104 also uses temporal information for detecting overcurrent faults in the forward and reverse directions. This enables the fault detection circuit 104 to detect overcurrent conditions in the forward direction (forward current) and reverse direction (reverse current). The fault detection circuit 104 can also detect a gate drive fault, which can be any sever fault identified by a gate drive of the fault detection circuit. Further features of the fault detection circuit 104 are now described with reference to FIGS. 2-4.

Figure 2A:
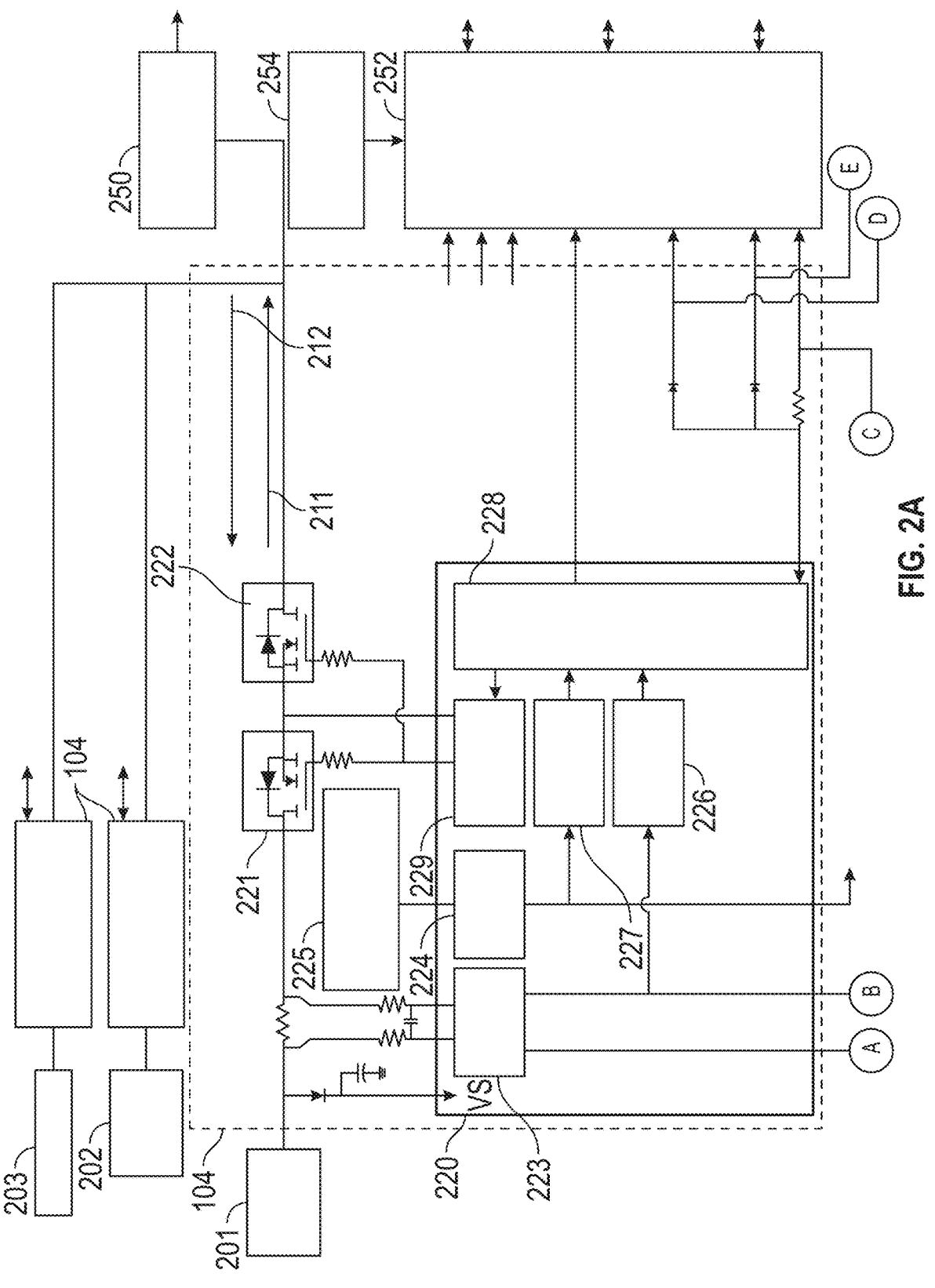
FIGS. 2A and 2B are a block diagram of the fault detection circuit of FIG. 1 for performing high-speed fault isolation for the power source of the vehicle of FIG. 1 according to one or more embodiments.
Figure 2B:
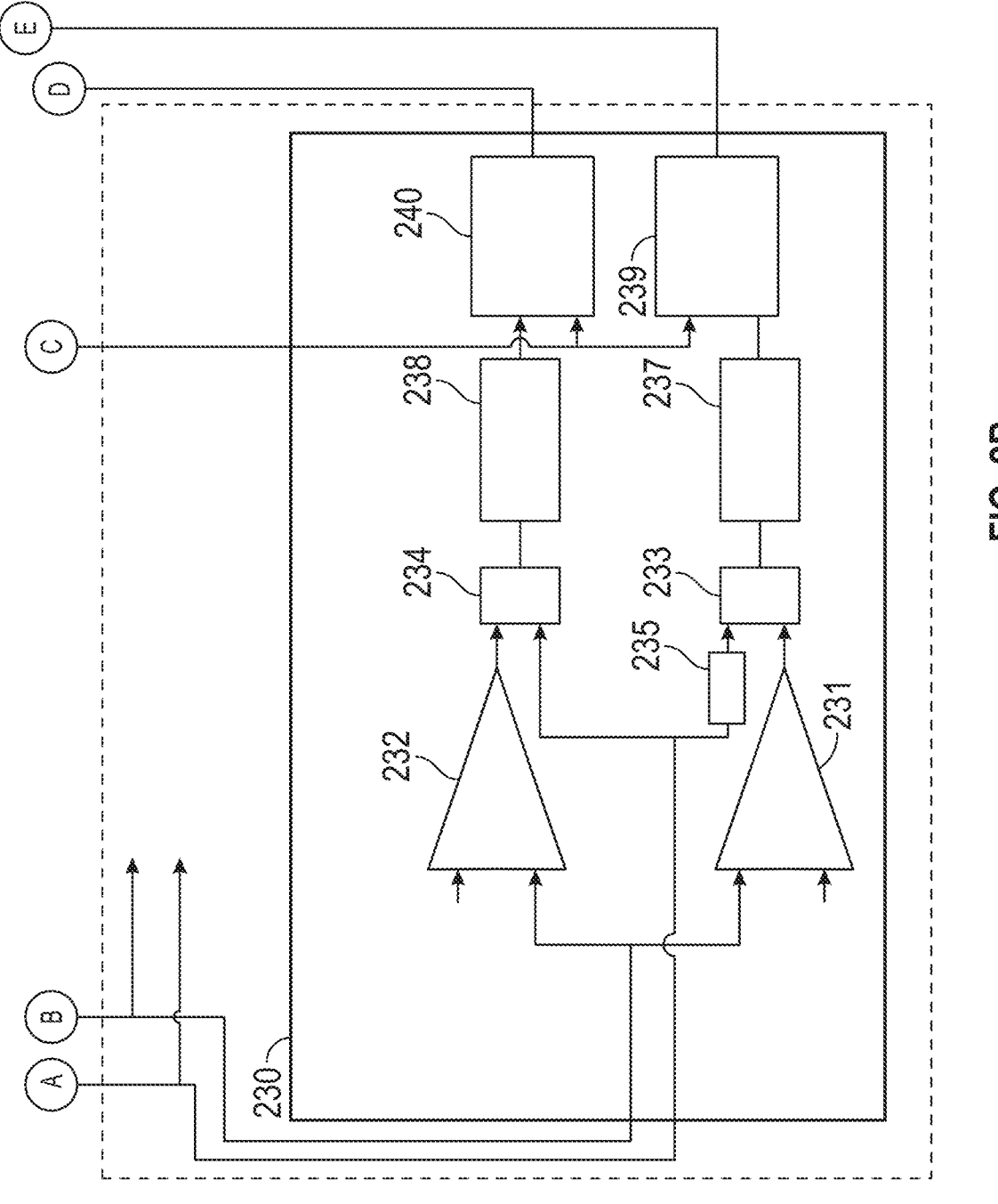

Particularly, FIGS. 2A and 2B are a block diagram of the fault detection circuit 104 for performing high-speed fault isolation for the power source 102 of the vehicle 100 according to one or more embodiments.

The fault detection circuit 104 is connected to the power source 102. Where multiple power sources are used, the fault detection circuit 104 can be duplicated and connected to each of the power sources. For example, in FIGS. 2A and 2B, the vehicle 100 includes three power sources: battery source 201, PCM source 202, and PG source 203. Each of the sources 201-203 has a fault detection circuit 104 associated therewith. A single instance of the fault detection circuit 104 is now described for the battery source 201, but it should be appreciated that the description applies to the fault detection circuits for each of the sources 201-203.

The fault detection circuit 104 includes switches 221, 222. According to one or more embodiments, the orientation of the switches 221, 222 can be arranged as shown or swapped. For example, the switches 221, 222 can share a common source (as shown in FIGS. 2A and 2B) or can share a common drain between the switches 221, 222 (not shown). The switches 221, 222 can be any suitable type of switching device, such as an N-type metal-oxide-semiconductor (NMOS), which use n-type metal-oxide-semiconductor field-effect transistors to implement logic gates and other digital circuits. Current can flow through the switches out of the battery source 201 and is referred to as forward current 211. Conversely, current can flow through the switches into the battery source 201 (such as from another of the sources 202, 203) and is referred to as reverse current 212.

The fault detection circuit 104 includes a gate driver 220 to control (e.g., open/disable and close/enable) the switches 221, 222. For example, if a fault (e.g., an overcurrent event) is detected, as described herein, the gate driver 220 can cause one or both of the switches 221, 222 to open, which can prevent damage from occurring to the battery source 201 or another source (e.g., one of the sources 202, 203), for example.

The gate driver 220 includes a current sense block 223 to sense a direction (e.g., forward current 211 or reverse current 212) and a magnitude (e.g., a number of amperes) of the current flowing into or out of the battery source 201. The current from the current sense block 223 can be used to determine overcurrent detection at block 226. According to one or more embodiments, opening one of the switches 221, 222 (depending on the direction of the current) acts to protect the fault detection circuit 104 from damage (e.g., NMOS switch and current sensor shunt). This overcurrent detection is useful for significant overcurrent events (e.g., where the current is significantly (e.g., 50% more) than a threshold but may not be efficient at detection less significant overcurrent events (e.g., 0.01% over a threshold). The gate driver 220 also includes a temperature sense block 224 that receives a temperature from a temperature sensor element 225 of the fault detection circuit 140 and uses the temperature to detect overcurrent temperature faults (e.g., the temperature is greater than a temperature threshold) at block 227. The gate driver 220 also includes a control logic 228 to control a gate drive block 229 based on the blocks 226 and 227 and/or based on a signal from an overcurrent monitor 230, described in more detail herein. The control logic 228 also sends gate driver fault status to an MCU 252 powered by an MCU power supply 254. The MCU can perform software-based processing as described herein with respect to FIGS. 4A and 4B, for example. The MCU 252 generates and/or receives fault isolation control signals for each of the sources 202 and 203 via their respective fault detection circuits 104.

The gate drive block 229 is connected to source and gate terminals of the switches 221, 222 as shown and causes the switches 221, 222 to selectively open/close based on decisions by the control logic 228. For example, an overcurrent or overtemperature event is detected at blocks 226, 227, respectively, the control logic 228 can signal the gate drive block 229 to cause one or both of the switches 221, 222 to open, thereby protecting the battery source 201, additional sources (e.g., the sources 202, 203), and/or the vehicle 100.

As described, the control logic 228 of the gate driver 220 can also be controlled by the overcurrent monitor 230 via a gate driver enable/control signal as shown. The overcurrent monitor 230 detects one or more of overcurrent in the forward direction (forward current 211) and/or overcurrent in the reverse direction (reverse current 212). The overcurrent detection block 226 and/or the overtemperature detection block 227 detects gate driver fault (e.g., fault of the gate driver 220). Gate driver fault may be any sever fault identified by the gate driver 220. The overcurrent monitor 230 can detect overcurrent in the forward direction and reverse direction. Hardware forward and reverse overcurrent detection thresholds may be set at different levels. According to one or more embodiments, the reverse overcurrent detection time of a particular power input is set less than the forward overcurrent detection times of the other power inputs to prevent a hard short to ground from asserting false fault detection of non-faulted power inputs (e.g., latching off those power inputs). Both hardware forward overcurrent detection and reverse overcurrent detection latch off the gate driver 220 to cause the gate drive block 229 to open one or more of the switches 221, 222 of the corresponding power input (e.g., the battery source 201) and assert fault detection interrupt to the MCU 252. Software may similarly detect overcurrent in the forward and reverse direction for soft short circuit condition and take action.

The overcurrent monitor 230 is now described in more detail. The overcurrent monitor 230 includes a first comparator 231 to detect overcurrent in the forward direction and a second comparator 232 to detect overcurrent in the reverse direction. The first comparator 231 compares the current ($I_{monitor}$) (from the current sense block 223 of the gate driver 220) with a forward current threshold (OVC_FWD_Threshold), and the output of the first comparator 231 is fed into OR gate 233 along with the inverse of the current direction ($I_{direction}$) via not gate 235. The OR gate 233 generates an output which is fed into a filter 237 that applies a forward overcurrent detection time period (e.g., in the order of hundreds of microseconds (μs)). If the output of the OR gate 233 exceeds the forward overcurrent detection time period (e.g., a forward current timing threshold) as determined at the filter 237, latch 239 generates an interrupt signal indicating a forward overcurrent event to the control logic 228 of the gate driver 220 and to the MCU 252.

The second comparator 232 compares the current ($I_{monitor}$) (from the current sense block 223 of the gate driver 220) with a reverse current threshold (OVC_SCG_Threshold), and the output of the second comparator 232 is fed into OR gate 234 along with the current direction ($I_{direction}$). The OR gate 234 generates an output which is fed into a filter 238 that applies a reverse overcurrent detection time period significantly less than the forward overcurrent detection time period. If the output of the OR gate 234 exceeds the reverse overcurrent detection time period (e.g., a reverse current timing threshold) as determined at the filter 238, latch 240 generates an interrupt signal indicating a reverse overcurrent event to the control logic 228 of the gate driver 220 and to the MCU 252.

According to one or more embodiments, comparator positive feedback for either or both of the first comparator 231 and the second comparator 232 may be added for hysteresis. It should be appreciated that the current threshold and time periods described with respect to FIGS. 2A and 2B are merely examples, and other threshold values and/or time period values can be used in other embodiments. It should also be appreciated that either or both of the latches 239, 240 can be SR-latches or D-flop with set and reset.

According to one or more embodiments, the fault detection circuit 104 can include additional components, such as shunts, resistors, capacitors, inductors, and/or the like, including combinations and/or multiples thereof. Assuming a steady state and transient loading/charging operation has been specified, one possible configuration of components to achieve desired hardware operation is now described. For example, the following hardware design specifications can be implemented for the fault detection circuit 104.

Consider the following assumptions/constraints:

$I_{NORMAL\_FWD}$ = normal operation steady state/transient loading current in the forward direction $I_{NORMAL\_REV}$ = normal operation steady state/transient charging current in the reverse direction $I_{OVC\_FWD\_SW}$ = desired software forward overcurrent threshold > $I_{NORMAL\_FWD}$ $I_{OVC\_REV\_SW}$ = desired software forward overcurrent threshold > $I_{NORMAL\_REV}$ $I_{OVC\_FWD\_HW}$ = desired hardware forward overcurrent threshold > $I_{OVC\_FWD\_SW}$ $I_{OVC\_REV\_HW}$ = desired hardware reverse overcurrent threshold > $I_{OVC\_REV\_SW}$ $$I_{OVC\_FWD\_SW} \geq I_{OVC\_REV\_SW}$$

$$I_{OVC\_FWD\_HW} \geq I_{OVC\_REV\_HW}$$

$I_{OVC\_GD\_HW}$ = gate driver overcurrent threshold (bi-directional) > $I_{OVC\_FWD\_HW}$ $T_{FILTER\_GD}$ = gate driver overcurrent shutdown detection filter time (~10 us)

$T_{FILTER\_FWD}$ = desired hardware forward overcurrent detection filter time > $T_{FILTER\_GD}$ $T_{FILTER\_REV}$ = desired hardware reverse overcurrent detection filter time <

$$T_{FILTER\_FWD} \ \& > T_{FILTER\_GD}$$

$T_{DETECT\_SW}$ = software forward/reverse overcurrent detection time (~50 ms) ≫ $T_{FILTER\_FWD}$ $Temp_{SDN\_threshold}$ = hardware overtemperature shutdown threshold < temperature rating of FET $T_{TEMP\_SDN}$ = hardware overtemperature shutdown time It should be appreciated that, according to one or more embodiments, the $T_{FILTER\_GD}$ is significantly less than the $T_{FILTER\_REV}$. For example, the $T_{FILTER\_GD}$ can be substantially 50% that of the $T_{FILTER\_REV}$, substantially 20% that of the $T_{FILTER\_REV}$, substantially 10% that of the $T_{FILTER\_REV}$, or less.

Choose a shunt resistor ($R_{SHUNT}$) and verify power rating is not exceeded under steady state and normal transient loading/charging conditions. The shunt resistor may be one or multiple shunt resistors in parallel to reduce individual component power dissipation.

Choose MOSFET (e.g., switches 221, 222) and verify power and thermal ratings are not exceeded under steady state and normal transient loading/charging conditions. One or multiple field-effect transistors can be implanted in parallel to reduce individual component power dissipation.

Choose current amplifier gain ($GAIN_{CS}$) to provide software to monitor reverse currents up to $I_{OVC\_REV\_HW}$ and forward currents up to $I_{OVC\_FWD\_HW}$).

Choose overcurrent detection comparator threshold voltages (resistor divider or precision trimmed voltage reference) to set the hardware forward and reverse overcurrent thresholds. Hysteresis may be designed into the comparator threshold by adding feedback resistor between comparator output and comparator positive input:

$$V_{OVC\_FWD\_HW} = (I_{OVC\_FWD\_HW} * R_{SHUNT}) * GAIN_{CS}$$

$$V_{OVC\_REV\_HW} = (I_{OVC\_REV\_HW} * R_{SHUNT}) * GAIN_{CS}$$

Design hardware forward and reverse overcurrent filter time (e.g., first order resistor and capacitor low pass filter time constant).

Minimum $T_{FILTER\_FWD}$ across power inputs is greater than maximum $T_{FILTER\_REV}$ for the power input being designed. This prevents simultaneous overcurrent detection/ shutdown between multiple power inputs in the case of short to ground at a power input. The $T_{FILTER\_FWD}$ can be set at substantially 2× larger than $T_{FILTER\_REV}$.

Verify hardware survivability of high current fault conditions:

Very hard short—fault resulting in forward/reverse current up to $I_{OVC\_GD\_HW}$+margin flowing for $T_{FILTER\_GD}$.

Hard ground short—fault resulting in reverse current up to $I_{OVC\_GD\_HW}$ flowing for $T_{FILTER\_REV}$.

Hard internal/load short—fault resulting in forward current up to $I_{OVC\_GD\_HW}$ flowing for $T_{FILTER\_FWD}$.

Soft ground short—fault resulting in reverse current up to $I_{OVC\_REV\_HW}$ flowing for $T_{DETECT\_SW}$.

Soft internal/load short—fault resulting in forward current up to $I_{OVC\_FWD\_HW}$ flowing for $T_{DETECT\_SW}$.

If shunt resistor or FETs are not able to survive any of the fault conditions, do one or multiple of the following: tune the overcurrent thresholds to a lower value without dropping below minimum system operability requirements; add parallel component (shunt or FET) to reduce individual power dissipation; change value of shunt or FET to reduce power dissipation; and change shunt or FET to better quality component with higher transient operation ratings.

FIG. 3 is a table 300 of thresholds used to perform high-speed fault isolation for power sources of a vehicle according to one or more embodiments. The table 300 shows thresholds for each of the power sources of FIGS. 2A and 2B (e.g., the battery source 201 (also referred to as "Power Source 1"), the PCM source 202 (also referred to as "Power Source 2"), and the PG source 203 (also referred to as "Power Source 3")). As shown, different thresholds and detection times can be set for hardware overcurrent versus software overcurrent determination (as further described herein). For example, for hardware overcurrent detection, a forward overcurrent threshold, a reverse overcurrent threshold, a gate driver over current threshold, and a gate driver over temperature threshold can be set. For software overcurrent detection, forward and reverse thresholds can be set.

Similarly, detection times can be set separately for forward and reverse overcurrent detection for hardware and software overcurrent detection, and gate driver overcurrent and gate driver overtemperature detection times can be set for hardware overcurrent detection, as shown. It should be appreciated that other thresholds and detection times can be implemented in other embodiments. According to one or more embodiments, an overtemperature shutdown time ($T_{TEMP\_SDN}$) is preset and is not configurable. An overtemperature shutdown threshold ($Temp_{SDN\_threshold}$) may be set through the hardware to limit the NMOS junction temperature within the rated value for the NMOS. According to one or more embodiments, hardware reverse overcurrent detection time can fill within a range of substantially 75 μs to 150 μs accounting for part-to-part variation. Hardware forward overcurrent detection time is greater than 150 μs across a range of part-to-part variation.

Figure 4A:
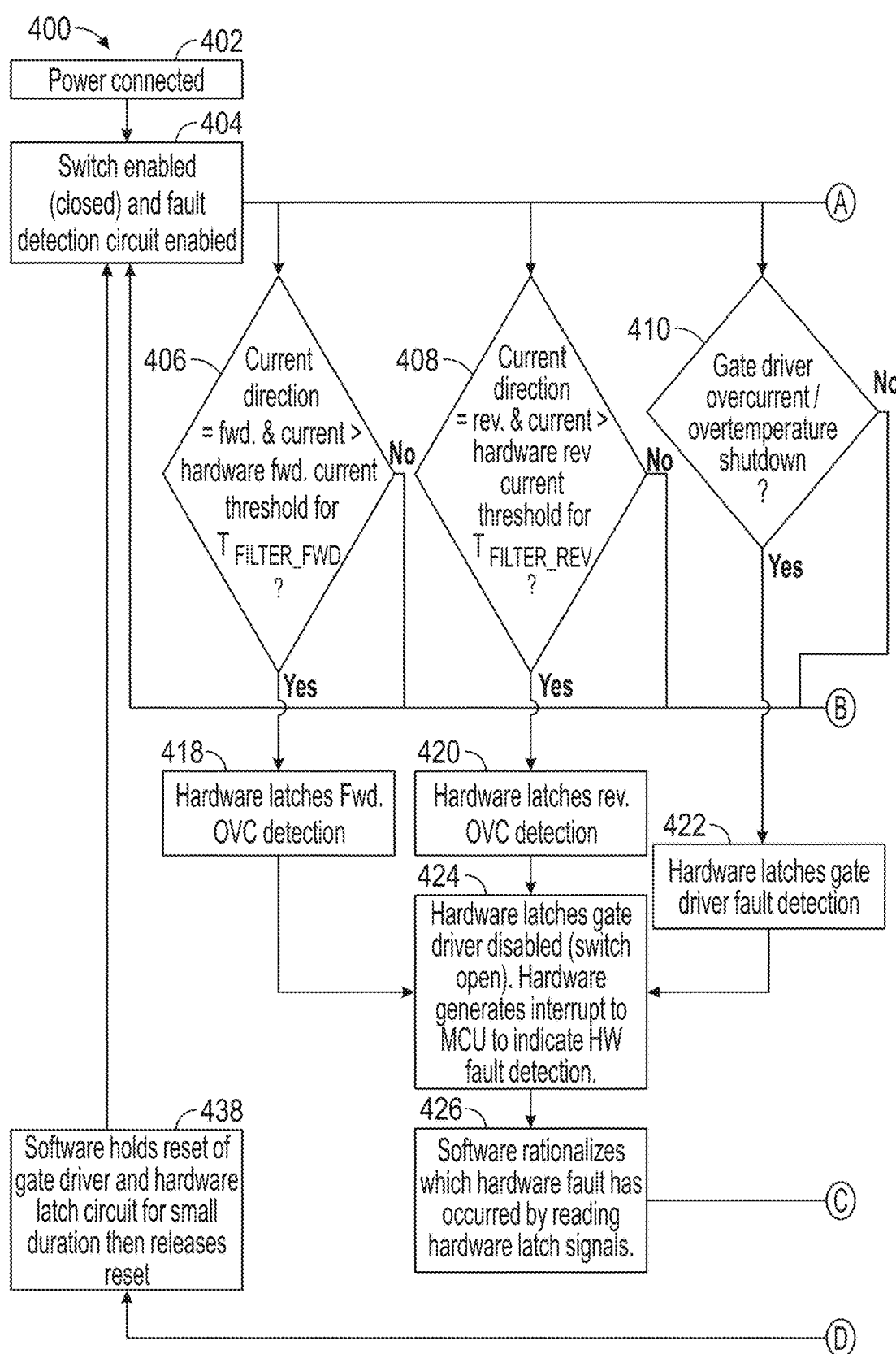
FIGS. 4A and 4B are a flow diagram of a method for performing high-speed fault isolation for power sources of a vehicle according to one or more embodiments.
Figure 4B:
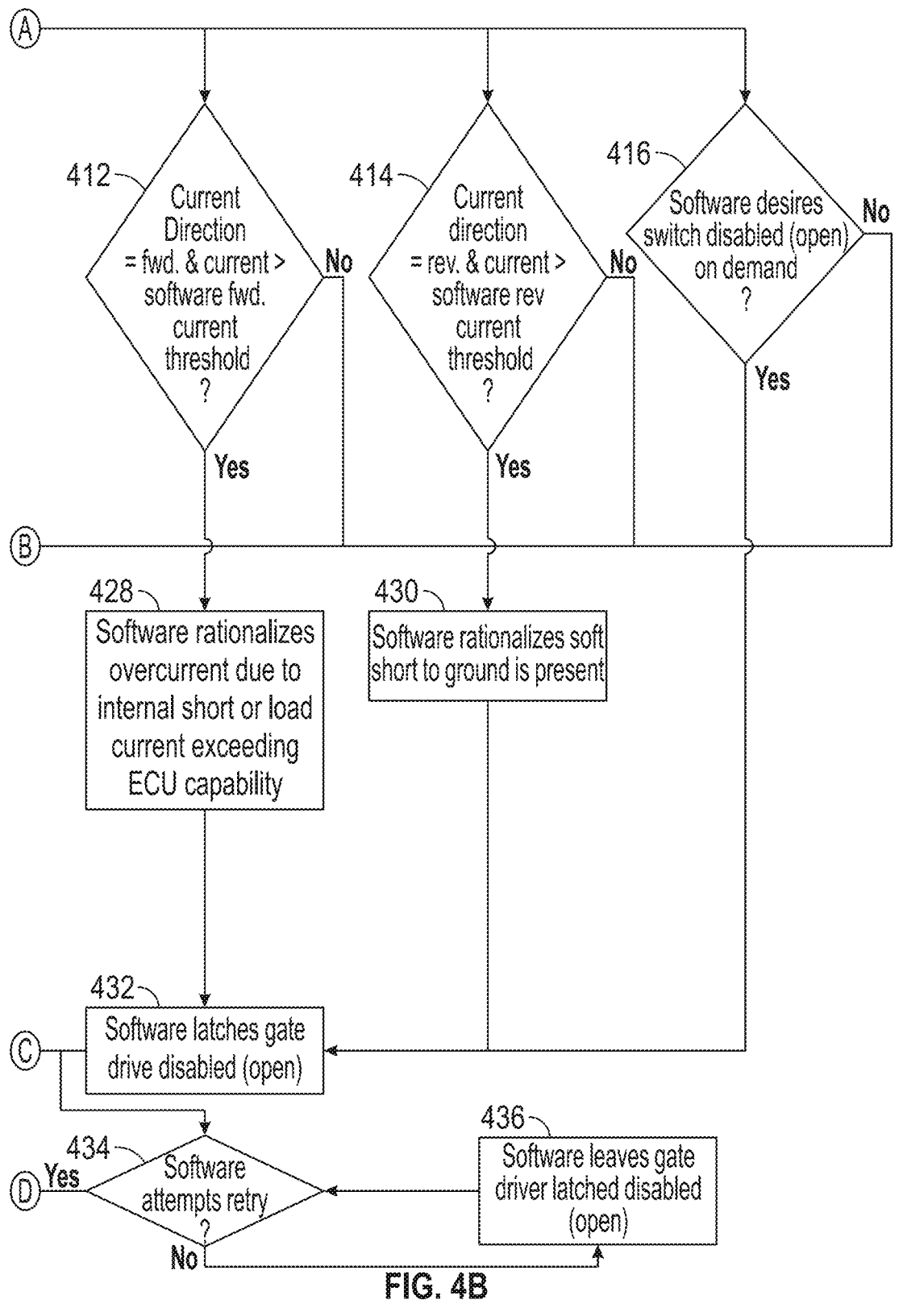

Further aspects and features of the fault detection circuit 104 are described herein with respect to the method 400 of FIGS. 4A and 4B and the method 500 of FIG. 5.

FIGS. 4A and 4B are a flow diagram of a method 400 for performing high-speed fault isolation for power sources of a vehicle according to one or more embodiments; according to one or more embodiments. The method 400 can be implemented using any suitable system or device. For example, the method 400 can be implemented using the fault detection circuit 104 of FIGS. 1 and 2.

The method 400 can be implemented using a combination of hardware and software, for example. According to one or more embodiments, the method 400 includes hardware portions (e.g., blocks 402, 404, 406, 408, 410, 418, 420, 422, 424) performed, in whole or in part, by some of the components shown in FIGS. 2A and 2B, such as the gate driver 220, the overcurrent monitor 230, one or more of the switches 221, 222, and/or the like, including combinations and/or multiples thereof. According to one or more embodiments, the method 400 also includes software portions (e.g., blocks 412, 414, 416, 426, 428, 430, 432, 434, 436, 438) performed, in whole or in part, by some of the components shown in FIGS. 2A and 2B, such as the MCU 252. It should be appreciated that, in other embodiments, some or all blocks that are performed by hardware in FIGS. 4A and 4B can instead be performed by software and/or some or all blocks that are performed by software in FIGS. 4A and 4B can instead be performed by hardware. The method 400 is now described with reference to FIGS. 1 and 2 but is not so limited.

At block 402, power is connected. For example, the power source 102 (which may be one or more of the battery source 201, the PCM source 202, and/or the PG source 203) is connected to the vehicle 100. At block 404, the switch (e.g., one of the switches 221, 222) is enabled (closed) and the fault detection circuit 104 is enabled.

At blocks 406-416, various determinations are made using the fault detection circuit 104, which are now described in more detail.

Blocks 406-410 and are now described, which relate to a hardware-based overcurrent detection. At block 406, it is determined whether the current is a forward current (e.g., I_direction=forward) and the current is greater than a hardware current threshold for the forward overcurrent detection time period ($T_{filter\_fwd}$). At block 408, it is determined whether the current is a reverse current (e.g., I_direction=reverse) and the current is greater than a hardware reverse current threshold for the reverse overcurrent detection time period ($T_{filter\_rev}$). At block 410, it is determined whether the gate driver 220 is experiencing an overcurrent fault or an over current temperature fault.

Blocks 412-416 are now described, which relate to a software-based overcurrent detection. At block 412, it is determined whether the current is a forward current (e.g., I_direction=forward) and the current is greater than a software current threshold. At block 414, it is determined whether the current is a reverse current (e.g., I_direction=reverse) and the current is greater than a software reverse current threshold. At block 416, it is determined whether it is desirable to disable (open) the switch (e.g., one of the switches 221, 222).

If any of blocks 406-416 result in a negative response (any of blocks 406-416 "No"), no faults are determined to have occurred. In this case, the method 400 returns to block 404 as shown to continue fault detection.

However, if any of blocks 406-416 result in a positive response (any of blocks 406-416 "Yes"), a fault condition is detected, and the method 400 proceeds to take action (e.g., to disable (open) the switch (e.g., one of the switches 221, 222)) as is now described.

If block 406 results in a positive response (block 406 "Yes"), the method 400 proceeds to block 418, and the latch 239 of the overcurrent monitor 230 latches the forward overcurrent detection. This condition may occur, for example, when an internal short or load current is exceeding a capacity of an electronic control unit (ECU) of the vehicle 100). If block 408 results in a positive response (block 408 "Yes"), the method 400 proceeds to block 420, and the latch 240 of the overcurrent monitor 230 latches the reverse overcurrent detection. This condition may occur, for example, where there is a hard short circuit to ground. If block 410 results in a positive response (block 410 "Yes"), the method 400 proceeds to block 422, and the gate driver 220 latches the gate driver fault detection (i.e., 226 or 227) via the control logic 228. This condition may occur, for example, when a hard short to ground is present, an internal short is present, load current is substantially exceeding ECU capability, a temperature of one or more of the switches 221, 222 exceeds a threshold, and/or the like, including combinations and/or multiples thereof. Subsequent to performing any of blocks 418, 420, or 422, the method 400 proceeds to block 424, where the overcurrent monitor 230 latches the gate driver 220 to disable (open) one or more of the switches 221, 222. Also at block 424, the overcurrent monitor 230 generates an interrupt to the MCU 252 to indicate a hardware fault was detected, as shown in FIGS. 2A and 2B. At block 426, the method 400 includes a software operation of rationalizing which hardware fault has occurred (forward overcurrent, reverse overcurrent, gate driver overcurrent/overtemperature) by reading the hardware latch signals from the overcurrent monitor 230.

If block 412 results in a positive response (block 412 "Yes"), the method 400 proceeds to block 428, which includes a software operation of rationalizing the forward overcurrent due to an internal short or load current exceeding the capacity of the ECU of the vehicle 100. If block 414 results in a positive response (block 414 "Yes"), the method 400 proceeds to block 430, which includes a software operation of rationalizing that a soft short to ground is present.

After performing either of blocks 428 or 430, or if block 416 results in a positive response (block 416 "Yes"), the method 400 proceeds to block 432, which includes a software operation of latching the gate drive block 229 disabled (open), thus opening one or both of the switches 221, 222.

Subsequent to performing blocks 426 and/or blocks 432, the method 400 then proceeds to block 434, which includes a software operation of determining whether to attempt a retry. If not (block 434 "No"), the software leaves the gate drive block 229 latched disabled (open) at block 436. If it is determined to attempt a retry (block 434 "Yes"), the method 400 proceeds to block 438, which includes a software operation of holding a reset of the gate driver 220 and the overcurrent monitor 230, such as for a short duration (e.g., 100 ms) of time, then releasing the reset. The method 400 then returns to block 404, and the method 400 can be repeated.

Additional processes also may be included, and it should be understood that the processes depicted in FIGS. 4A and 4B represent illustrations, and that other processes may be added, or existing processes may be removed, modified, or rearranged without departing from the scope of the present disclosure. It should also be understood that the processes depicted in FIGS. 4A and 4B may be implemented as programmatic instructions stored on a non-transitory computer-readable storage medium that, when executed by a processor of a computing system, cause the processor to perform the processes described herein.

FIG. 5 is a flow diagram of a method 500 for performing high-speed fault isolation for power sources of a vehicle according to one or more embodiments. The method 500 can be implemented using any suitable system or device. For example, the method 500 can be implemented using the fault detection circuit 104 of FIGS. 1 and 2. The method 500 is now described with reference to FIGS. 1 and 2 but is not so limited.

At block 502, the overcurrent monitor 230 receives, from a current sensor (e.g., the current sense block 223) associated with a power source (e.g., the power source 102) of a vehicle (e.g., the vehicle 100), a current. At block 504, the overcurrent monitor 230 determines a direction of the current relative to the power source. That is, it is determined whether the current is a forward current (e.g., forward current 211) flowing out of the power source or a reverse current (e.g., reverse current 212) flowing into the power source. At block 506, responsive to determining that the direction of the current relative to the power source is a forward current flowing out of the power source, the overcurrent monitor 230 determines whether the forward current exceeds a forward current threshold for a forward overcurrent detection time period by comparing the current to the forward current threshold. At block 508, responsive to determining that the direction of the current relative to the power source is a reverse current flowing into the power source, the overcurrent monitor 230 determines whether the reverse current exceeds a reverse current threshold for a reverse overcurrent detection time period shorter than the forward overcurrent detection time period by comparing the current to the reverse current threshold. At block 510, responsive to determining that the forward current exceeds the forward overcurrent detection current threshold for the forward overcurrent detection time period, or responsive to determining that the reverse current exceeds the reverse current threshold for the reverse overcurrent detection time period, the gate driver 220 causes at least one switch (e.g., at least one of the switches 221, 222) associated with the power source to inhibit the current.

Additional processes also may be included, and it should be understood that the processes depicted in FIG. 5 represent illustrations, and that other processes may be added, or existing processes may be removed, modified, or rearranged without departing from the scope of the present disclosure.

It should also be understood that the processes depicted in FIG. 5 may be implemented as programmatic instructions stored on a non-transitory computer-readable storage medium that, when executed by a processor of a computing system, cause the processor to perform the processes described herein.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method comprising:

receiving, from a current sensor associated with a power source of a vehicle, a current;

determining a direction of the current relative to the power source;

responsive to determining that the direction of the current relative to the power source is a forward current flowing out of the power source, determining, by an overcurrent monitor, whether the forward current exceeds a forward current threshold for a forward overcurrent detection time period by comparing the current to the forward current threshold;

responsive to determining that the direction of the current relative to the power source is a reverse current flowing into the power source, determining, by the overcurrent monitor, whether the reverse current exceeds a reverse current threshold for a reverse overcurrent detection time period shorter than the forward overcurrent detection time period by comparing the current to the reverse current threshold;

responsive to determining that the forward current exceeds the forward current threshold for the forward overcurrent detection time period, or responsive to determining that the reverse current exceeds the reverse current threshold for the reverse overcurrent detection time period, controlling, using a gate driver, at least one switch associated with the power source to inhibit the current;

detecting a gate driver fault of the gate driver; and responsive to detecting the gate driver fault of the gate driver, controlling, using the gate driver, the at least one switch associated with the power source to inhibit the current.

2. The method of claim 1, wherein the current sensor is disposed in the gate driver.

3. The method of claim 2, wherein the gate driver comprises the current sensor, a temperature sense block to receive a temperature from a temperature sensor element, an overcurrent detection block, an overtemperature detection block, a gate drive block, and a control logic.

4. The method of claim 3, wherein the gate drive block of the gate driver controls the at least one switch associated with the power source.

5. The method of claim 1, wherein the overcurrent monitor comprises a first comparator to detect overcurrent in the forward current and a second comparator to detect overcurrent in the reverse current.

6. The method of claim 5, wherein the overcurrent monitor further comprises a first latch associated with the first comparator to cause a gate drive block of the gate driver to control the at least one switch responsive to determining that the forward current exceeds the forward current threshold for the forward overcurrent detection time period.

7. The method of claim 6, wherein the overcurrent monitor further comprises a second latch associated with the second comparator to cause the gate drive block of the gate driver to control the at least one switch responsive to determining that the reverse current exceeds the reverse current threshold for the reverse overcurrent detection time period.

8. The method of claim 1, further comprising transmitting a signal to a microprocessor responsive to determining that the forward current exceeds the forward current threshold for the forward overcurrent detection time period, or responsive to determining that the reverse current exceeds the reverse current threshold for the reverse overcurrent detection time period.

9. The method of claim 1, wherein the at least one switch comprises a N-type metal-oxide-semiconductor.

10. A vehicle comprising:

a power source;

at least one switch associated with the power source; and a fault detection circuit, wherein the fault detection circuit comprises a gate driver and an overcurrent monitor, the overcurrent monitor performing operations comprising:

receiving, from a current sensor of the gate driver, a current;

determining a direction of the current relative to the power source;

responsive to determining that the direction of the current relative to the power source is a forward current flowing out of the power source, determining whether the forward current exceeds a forward current threshold for a forward overcurrent detection time period by comparing the current to the forward current threshold;

responsive to determining that the direction of the current relative to the power source is a reverse current flowing into the power source, determining whether the reverse current exceeds a reverse current threshold for a reverse overcurrent detection time period shorter than the forward overcurrent detection time period by comparing the current to the reverse current threshold;

responsive to determining that the forward current exceeds the forward current threshold for the forward overcurrent detection time period, or responsive to determining that the reverse current exceeds the reverse current threshold for the reverse overcurrent detection time period, causing the gate driver to control the at least one switch associated with the power source to inhibit the current;

detecting a gate driver fault of the gate driver; and responsive to detecting the gate driver fault of the gate driver, controlling, using the gate driver, the at least one switch associated with the power source to inhibit the current.

11. The vehicle of claim 10, wherein the current sensor is disposed in the gate driver.

12. The vehicle of claim 11, wherein the gate driver comprises the current sensor, a temperature sense block to receive a temperature from a temperature sensor element, an overcurrent detection block, an overtemperature detection block, a gate drive block, and a control logic.

13. The vehicle of claim 12, wherein the gate drive block of the gate driver controls the at least one switch associated with the power source.

14. The vehicle of claim 10, wherein the overcurrent monitor comprises a first comparator to detect overcurrent in the forward current and a second comparator to detect overcurrent in the reverse current.

15. The vehicle of claim 14, wherein the overcurrent monitor further comprises a first latch associated with the first comparator to cause a gate drive block of the gate driver to control the at least one switch responsive to determining that the forward current exceeds the forward current threshold for the forward overcurrent detection time period.

16. The vehicle of claim 15, wherein the overcurrent monitor further comprises a second latch associated with the second comparator to cause the gate drive block of the gate driver to control the at least one switch responsive to determining that the reverse current exceeds the reverse current threshold for the reverse overcurrent detection time period.

17. The vehicle of claim 10, wherein the operations further comprise transmitting a signal to a microprocessor responsive to determining that the forward current exceeds the forward current threshold for the forward overcurrent detection time period, or responsive to determining that the reverse current exceeds the reverse current threshold for the overcurrent detection reverse time period.

18. An overcurrent monitor for determining a forward overcurrent in a current flowing out of a power source of a vehicle in a forward direction or determining a reverse overcurrent of a current flowing into the power source of the vehicle in a reverse direction, the overcurrent monitor comprising:

a first comparator to detect forward overcurrent by comparing the current flowing out of the power source in the forward direction to a forward current threshold;

a second comparator to detect reverse overcurrent by comparing the current flowing into the power source in the reverse direction to a reverse current threshold;

a first filter to receive a first output of the first comparator and to apply a forward current timing threshold to the first output;

a second filter to receive a second output of the second comparator and to apply a reverse current timing threshold to the second output, the forward current timing threshold being greater than the reverse current timing threshold;

a first latch associated with the first comparator to cause a gate driver to control at least one switch associated with the power source responsive to determining that current flowing out of the power source in the forward direction exceeds the forward current threshold for the forward current timing threshold;

a second latch associated with the second comparator to cause the gate driver to control the at least one switch associated with the power source responsive to determining that current flowing into the power source in the reverse direction exceeds the reverse current threshold for the reverse current timing threshold;

wherein a signal from the overcurrent monitor is used to control a gate driver, wherein responsive to detecting a gate driver fault of the gate driver, the gate driver controls the at least one switch associated with the power source to inhibit the current.

19. The overcurrent monitor of claim 18, wherein the first comparator implements comparator positive feedback.

20. The overcurrent monitor of claim 18, wherein the second comparator implements comparator positive feedback.

\* \* \* \* \*